US012132445B2

(12) United States Patent
Sabban

(10) Patent No.: US 12,132,445 B2
(45) Date of Patent: Oct. 29, 2024

(54) DEVICE AND METHOD FOR DETECTING A FAULT CURRENT IN A PHOTOVOLTAIC INSTALLATION, AND PHOTOVOLTAIC INVERTER COMPRISING THE DEVICE

(71) Applicant: SMA Solar Technology AG, Niestetal (DE)

(72) Inventor: Martin Sabban, Kassel (DE)

(73) Assignee: SMA Solar Technology AG, Niestetal (DE)

( * ) Notice: Subject to any disclaimer, the term of this patent is extended or adjusted under 35 U.S.C. 154(b) by 64 days.

(21) Appl. No.: 18/072,749

(22) Filed: Dec. 1, 2022

(65) Prior Publication Data

US 2023/0086841 A1 Mar. 23, 2023

Related U.S. Application Data

(63) Continuation of application No. PCT/EP2021/065162, filed on Jun. 7, 2021.

(30) Foreign Application Priority Data

Jun. 15, 2020 (DE) ..................... 10 2020 115 757.6
Sep. 9, 2020 (DE) ..................... 10 2020 123 493.7

(51) Int. Cl.
*H02S 50/10* (2014.01)
*G01R 31/52* (2020.01)
*H02S 50/00* (2014.01)

(52) U.S. Cl.
CPC .............. *H02S 50/10* (2014.12); *G01R 31/52* (2020.01)

(58) Field of Classification Search
CPC ....................................... G01R 31/52
See application file for complete search history.

(56) References Cited

U.S. PATENT DOCUMENTS 10,075,129 B2 9/2018 Lee
2002/0105765 A1* 8/2002 Kondo ................ H02H 7/1222
361/42

(Continued)

FOREIGN PATENT DOCUMENTS

DE 2613972 A1 10/1977
EP 2372857 A1 10/2011

(Continued)

OTHER PUBLICATIONS

International Search Report dated Aug. 31, 2021 in connection with PCT/EP2021/065162.

*Primary Examiner* — Alesa Allgood
(74) *Attorney, Agent, or Firm* — Eschweiler & Potashnik, LLC

(57) ABSTRACT

The disclosure is directed to a detection device for detecting a fault current ($I_{fault}$) at a PV generator and/or at DC lines of a PV installation assigned to the PV generator. The PV generator has at least one first PV string and a second PV string, which are connected to a PV inverter of the PV installation via in each case two DC lines. In this case, the detection device has at least one current transformer and an evaluation circuit connected to the at least one current transformer. The current transformer can be used jointly by the first PV string and the second PV string, wherein a measurement signal of the jointly usable current transformer represents a difference between a first summation current ($I_{sum,1}$) flowing from the first PV string towards the ground potential (PE) and a second summation current ($I_{sum,2}$) flowing from the second PV string towards the ground potential (PE). The fault current ($I_{fault}$), when it arises, is a part of the first summation current ($I_{sum,1}$) and/or the second summation current ($I_{sum,2}$). The disclosure also includes a (Continued)

PV inverter having a corresponding detection device and also a method for detecting a fault current ($I_{fault}$).

18 Claims, 4 Drawing Sheets

(56) References Cited

U.S. PATENT DOCUMENTS

| | | | |
|---|---|---|---|
| 2003/0075211 A1* | 4/2003 | Makita | H02H 3/337 |
| | | | 136/244 |
| 2011/0199707 A1 | 8/2011 | Kazemi et al. | |
| 2012/0048326 A1* | 3/2012 | Matsuo | H02S 50/10 |
| | | | 702/65 |
| 2012/0049627 A1* | 3/2012 | Matsuo | H01L 31/02021 |
| | | | 307/43 |
| 2012/0299576 A1 | 11/2012 | Kasai et al. | |
| 2013/0043880 A1 | 2/2013 | Bettenwort et al. | |
| 2015/0137850 A1 | 5/2015 | Falk et al. | |

FOREIGN PATENT DOCUMENTS

| | | |
|---|---|---|
| EP | 2945193 A1 | 11/2015 |
| EP | 2947468 A1 | 11/2015 |

\* cited by examiner

DEVICE AND METHOD FOR DETECTING A FAULT CURRENT IN A PHOTOVOLTAIC INSTALLATION, AND PHOTOVOLTAIC INVERTER COMPRISING THE DEVICE

CROSS REFERENCE TO RELATED APPLICATIONS

This application is a continuation of International Patent Application Number PCT/EP2021/065162, filed on Jun. 7, 2021, which claims priority to German Patent Application number 10 2020 115 757.6, filed on Jun. 15, 2020 and also to German Patent Application number 10 2020 123 493.7 filed on Sep. 9, 2020, and is hereby incorporated by reference in its entirety.

FIELD

The disclosure relates to a device and a method for detecting a fault current in a photovoltaic installation (PV installation). The fault current may in particular be a relatively small resistive current which can occur in addition to a relatively large capacitive leakage current which is always present in normal operation of the PV installation. The disclosure additionally relates to a photovoltaic inverter (PV inverter) comprising such a device.

BACKGROUND

A photovoltaic installation (PV installation) may comprise a multiplicity of electrical components, in particular photovoltaic (PV) modules, which are distributed in a decentralized manner over a large area. A group of PV modules, which is grouped as a string, i.e., in the form of a series circuit, is also called a photovoltaic string (PV string). A photovoltaic (PV) generator of a photovoltaic (PV) installation can have one or more photovoltaic (PV) sub-generators, which are connected in parallel to one another, in some cases respectively via a separate DC/DC converter comprising a shared direct voltage link circuit (DC link circuit) of a PV inverter. Each of the PV sub-generators can have one or more PV strings connected in parallel to one another. For design-related reasons, the PV modules of a PV installation always have an electrical capacitance in relation to their surroundings, in particular in relation to their usually grounded mounting system. This capacitance is not absolutely necessary for the function of the PV installation but does inevitably result from the mechanical design of the PV modules. It is therefore often referred to as "parasitic capacitance" or "leakage capacitance." The parasitic capacitance of the PV installation usually increases with the size of the PV generator assigned thereto, which is why a powerful PV generator also has a correspondingly large parasitic capacitance. In addition, the parasitic capacitance is dependent on ambient conditions and, for example, increases further during rain due to an associated moist surface of the PV modules and/or due to a dielectric constant of the air that changed on account of increased humidity.

In normal operation of the PV installation, the PV modules of the PV generator usually also have an AC voltage in relation to the ground potential (PE) in addition to a DC voltage prevailing between their terminals. The AC voltage of the PV modules is in particular pronounced, but not exclusively, in PV installations comprising a transformerless PV inverter. The AC voltage of the PV modules in relation to the ground potential depends on the individual circuit topology of the PV inverter and usually has a frequency which corresponds to a frequency of the AC grid or an integer multiple of the frequency of the AC grid to which the PV inverter is connected on the output side. Based on the AC voltage of the PV modules and their parasitic capacitance in relation to the ground potential, a more or less strong leakage current of the PV generator toward the ground potential always results in normal operation of the PV installation.

If, due to a fault, e.g., a defective line insulation, a grounded person now comes into contact with a live component of the PV generator, e.g., the defective line, an additional fault current toward the ground potential results, usually abruptly, due to the direct contact. Since a fault current can be hazardous starting at a value of approximately 30 mA, it is generally required to detect such a fault current reliably and to initiate further measures, for example, a shutdown and/or short-circuiting of the PV generator, in particular of the relevant PV sub-generator, when such a fault current is detected.

Due to ever increasing nominal powers of PV installations, the parasitic capacitances of the assigned PV generators or PV sub-generators also rise and thus also the capacitive leakage currents always present in normal operation of the PV installation. However, the threshold value of, for example, 30 mA assigned to the fault current remains constant but can still be reduced based on stricter normative constraints, if necessary. Therefore, any fault current that may be present can be significantly smaller compared to the always present capacitive leakage current of the PV installation. The detection of the fault current is therefore increasingly more complex and more expensive due to the low signal-to-noise ratio and the associated measuring systems to be designed with sensitivity. It is therefore desirable, in particular also in the case of larger PV installations, to be able to detect a potentially occurring fault current reliably and nevertheless cost-effectively, especially if the potentially occurring fault current is small compared to the capacitive leakage current always present in normal operation of the PV installation.

Publication EP 2372857 A1 discloses a method for determining a fault current component of a differential current, wherein the differential current is composed of a leakage current component and a fault current component. In the method, the differential current is detected as a current sum via AC lines conducting the current of an alternating current generator. An electrical signal dependent on voltages at the alternating current generator in relation to the ground potential is multiplied by a scaling factor with regard to a capacitance in relation to the ground potential. Finally, the electrical signal scaled in this way is subtracted from the differential current as a measure of the leakage current component.

SUMMARY

The disclosure is directed to a device and a method with which even small fault currents within usually high leakage currents of a PV installation can be reliably detected. The device/method should be able to be realized in a simple and cost-effective manner. The disclosure is also directed to a PV inverter suitable for carrying out the method.

A detection device for detecting a fault current at a PV generator and/or at DC lines of a PV installation assigned to the PV generator has at least one current transformer and an evaluation circuit or unit connected to the at least one current transformer. The PV generator has at least a first PV string and a second PV string, which are connected via in each case two DC lines to a PV inverter of the PV installation. The current transformer comprises, in one embodiment, a current transformer which is jointly usable or used jointly by the first PV string and the second PV string. A current transformer is a measuring circuit or device which converts a current into a further processable measurement signal. A measurement signal of the current transformer represents a difference between a first summation current flowing from the first PV string toward the ground potential and a second summation current flowing from the second PV string toward the ground potential. A fault current, when it occurs, is a part of the first and/or the second summation current. The fault current can therefore also be detected via the difference between the first summation current and the second summation current.

Such a detection device has the advantage that a leakage current of two PV strings, which is generally always present in normal operation of the PV installation and flows toward the ground potential (PE), can be largely compensated and, under some circumstances, even extinguished. In one embodiment, the first summation current comprises the sum of a first leakage current of the first PV string flowing toward the ground potential and, when it occurs, a fault current, likewise flowing toward the ground potential, at the first PV string. In this case, the second summation current comprises the sum of a second leakage current of the second PV string flowing toward the ground potential and, when it occurs, a fault current, likewise flowing toward the ground potential, at the second PV string. In one embodiment, the first PV string and the second PV string are identically, or at least similarly, configured both with regard to the number of PV modules and their type. In addition, they are, in one embodiment, adjacent PV strings, i.e., PV strings that are arranged spatially close to one another. In this way, similar ambient conditions prevail at the first and second PV strings. Therefore, the two PV strings are configured similarly with regard to their parasitic capacitances so that the first leakage current can be largely extinguished, but at least significantly reduced, by the formation of the difference with the second leakage current. The same also applies in the reverse case, namely that the second leakage current is also compensated as much as possible by the formation of the difference with the first leakage current and, under some circumstances, can even be extinguished. In this way, a background signal of the leakage currents, which is usually present in normal operation of the PV installation and superimposes any fault current that may occur, is reduced as much as possible. If a fault current now occurs in one of the summation currents in addition to the always present leakage current, the fault current from the always present background signal becomes more pronounced the more compensating the difference between the leakage currents of the first and second PV string is. In any case, a measurement signal representing the fault current is more significant than would be the case without the difference formation of the summation currents. Since the background signal of the current transformer is significantly reduced, the current transformer can be configured to have a small nominal current which also detects small fault currents. The usually high background signal or noise signal, i.e., the entire and generally significantly larger leakage current of a PV string, is not measured, or is measured to a significantly reduced extent, due to the difference formation of the two summation currents. In addition, equally changing ambient conditions, which usually have a similar effect on the parasitic capacitances of the adjacent PV strings, can also be at least partially compensated.

Advantageous embodiments of the disclosure are specified in the following description and the dependent claims, the features of which can be applied individually and in any desired combination with one another.

In one embodiment of the detection device, the jointly usable current transformer is configured as a jointly usable toroidal current transformer. A toroidal current transformer within the meaning of the application is understood to mean an inductively operating current transformer. A toroidal current transformer can have at least one coil, which is passed through by a magnetic field of a current-carrying conductor in order to detect the current flowing through the conductor. The coil can at least partially surround the current-carrying conductor at a point along its circumference. For bundling the magnetic field of the conductor to be measured, the toroidal current transformer can have a usually annular magnetic core around which the coil is wound so that the magnetic core passes through the coil. In such an embodiment, the conductor is at least partially also surrounded along its circumference by the magnetic core. The magnetic core may be a closed, and also a non-closed, magnetic core, for example, a magnetic core having a gap. The magnetic core can be configured to be foldable in a manner similar to a current probe in order to enable the conductor to be enclosed along its circumference in a simple manner. In the case of a toroidal current transformer whose magnetic core has a gap, the detection of the current flowing through the conductor can also be achieved via a stray magnetic field which is located at the gap and generated by the current to be measured. For this purpose, the toroidal current transformer can have, as an alternative to the coil, a Hall sensor via which the stray magnetic field is detected. The toroidal current transformer can additionally have a compensation circuit, via which a magnetic field generated by the current-carrying conductor in the magnetic core is compensated, wherein the input variables of the compensation circuit that are employed for compensation are used as a measure for the current to be measured. In general, the toroidal current transformer may be configured to measure AC currents and possibly also DC currents. With the toroidal current transformer, it is also possible to detect a combination of currents flowing in a plurality of conductors at a time. This is the case when the current-carrying conductors are jointly surrounded by the toroidal current transformer, that is to say the current-carrying conductors jointly pass through the toroidal current transformer. In this case, the magnetic fields which are generated by the currents flowing in the plurality of conductors also simultaneously pass through the at least one coil of the toroidal current transformer. In this case, currents whose magnetic fields pass through the at least one coil of the toroidal current transformer in the same directions are added to one another, while currents which pass through the at least one coil of the toroidal current transformer in opposite directions are subtracted from one another. The subtraction of the currents is the case, for example, when the currents flowing in the two conductors pass through the toroidal current transformer in opposite directions. In the embodiment of the disclosure, for the detection of the measurement signal, the toroidal current transformer is now passed through by the two DC lines of the first PV string and the two DC lines of the second PV string. In one embodiment, the two DC lines of the first PV string are oriented relative to the two DC lines of the second PV string such that the summation currents flowing therein, which are substantially formed in normal operation of the PV installation by the first leakage current flowing toward the ground potential and the second leakage current flowing toward the ground potential, pass through the toroidal current transformer in opposite directions. In this way, the toroidal current transformer, as a current transformer, offers a simple form of the difference formation of the first and the second summation currents, wherein the difference formation is realized by the first leakage current flowing from the first PV string toward the ground potential and the second leakage current flowing from the second PV string toward the ground potential passing through the toroidal current transformer in opposite directions.

In one embodiment of the detection device, the two DC lines of the first PV string are arranged relative to one another such that, during normal operation of the PV installation, a DC current flowing therein between the first PV string and the PV inverter passes through the toroidal current transformer in two directions opposite one another. The two DC lines of the second PV string are also arranged relative to one another such that, during normal operation of the PV installation, a DC current flowing in the DC lines between the second PV string and the PV inverter passes through the toroidal current transformer in two directions opposite one another. In this case, a DC line connected to a positive pole of the first PV string is arranged relative to a DC line connected to a positive pole of the second PV string such that, during normal operation of the PV installation, the DC currents flowing between the respective PV strings and the PV inverter in the DC lines assigned to the positive poles pass through the toroidal current transformer in opposite directions. In this way, a DC current of the first PV string flowing in the positive DC line is compensated in the measurement signal of the toroidal current transformer by the DC current of the first PV string flowing in the negative DC line. In addition, a DC current of the second PV string flowing in the positive DC line is also compensated in the measurement signal of the toroidal current transformer by the DC current of the second PV string flowing in the negative DC line. In this case, the DC currents flowing between the PV strings and the PV inverter each represent a working current of the first PV string or of the second PV string. These DC currents are also always present in a normal operation of the PV installation. In addition to the DC currents, however, the first leakage current of the first PV string flowing toward the ground potential is also compensated by the second leakage current of the second PV string flowing toward the ground potential, and vice versa. This is the case since the first leakage current of the first PV string flowing toward the ground potential passes through the toroidal current transformer in the opposite direction to the second leakage current of the second PV string flowing toward the ground potential.

According to a further embodiment of the detection device, the first PV string can comprise a combination of two PV substrings. In this case, the DC lines of the PV substrings are arranged relative to one another in such a way that, during normal operation of the PV installation, the DC currents in the DC lines assigned to the positive poles of the PV substrings pass through the toroidal current transformer in the same directions. Likewise, the DC lines assigned to the negative poles of the PV substrings are arranged relative to one another such that, during normal operation of the PV installation, the DC currents flowing in the DC lines assigned to the negative poles pass through the toroidal current transformer in the same directions. In contrast, each DC line assigned to the positive pole of the PV substrings is arranged relative to each DC line assigned to the negative pole of the PV substrings such that, during the normal operation of the PV installation, the DC currents in the respective DC lines pass through the toroidal current transformer in opposite directions. In this case, the PV substrings can advantageously be configured with respect to their nominal power such that a nominal power of the first PV substring is at least 50% smaller, or at least 70% smaller, than a nominal power of the second PV substring. By treating two PV strings as PV substrings and combining them into just one PV string, sufficient compensation of the leakage currents flowing toward the ground potential and, associated therewith, a still sufficiently high signal-to-noise ratio during the detection of the fault current, can also be achieved even if the jointly used toroidal current transformer has an odd number of PV strings passing through it.

In one embodiment of the detection device, the current transformer is configured for a maximum value which corresponds to a value of at most 50%, or at most 25%, or at most 15% of the greater of the two values from the first leakage current and the second leakage current. The first leakage current characterizes a current flowing from the first PV string toward the ground potential in normal operation of the PV installation, and the second leakage current characterizes a current flowing from the second PV string toward the ground potential in normal operation of the PV installation. In this case, a normal operation of the PV installation denotes an operating state in which the PV installation is in operation and no fault current or nearly no fault current is flowing. This embodiment enables a particularly cost-effective embodiment of the current transformer.

In one embodiment, the detection device is configured not only to detect a fault current $I_{fault}$ on one or more PV strings, but also to determine the PV string of the PV installation in which the fault current $I_{fault}$ occurs. For this purpose, the PV installation at which the detection of the fault current $I_{fault}$ is to occur by means of the detection device has a number n, with n>2, of PV strings. In addition, the detection device has an equal number n, with n>2, of toroidal current transformers which are connected to the evaluation circuit or unit of the detection device. For the detection of the measurement signal, each of the toroidal current transformers is passed through by the DC lines of two different PV strings. In addition, the passage through the toroidal current transformers is configured such that the DC lines of each PV string each pass through two different toroidal current transformers. The combination of the toroidal current transformers passing through the respective PV string then characterizes the PV string.

This embodiment offers the advantage that not only can a fault current in the PV installation be detected, but the PV string assigned to the fault current can also be determined. This is because, specifically, with each of its DC lines, each PV string passes through a particular combination of two different toroidal current transformers that is specific to the respective PV string. A fault current of a particular PV string therefore leads to a corresponding measurement signal of those toroidal current transformers which are passed through by the corresponding PV string. Accordingly, the PV string the DC lines of which pass through both toroidal current transformers which detect a fault current is thus likely also the PV string that can be assigned to the fault current.

A method according to the disclosure serves to detect a fault current in a PV installation with a detection device according to the disclosure. In this case, a PV generator of the PV installation has at least a first PV string and a second PV string, which are connected via in each case two DC lines to a PV inverter of the PV installation. The method comprises at least the following steps:

detecting a measurement signal of the at least one current transformer of the detection device, wherein the measurement signal represents a difference between a first summation current flowing from the first PV string toward the ground potential and a second summation current flowing from the second PV string toward the ground potential; and signaling a fault current if the detected measurement signal exceeds a first threshold value.

The method results in the advantages already explained in connection with the detection device.

In one embodiment of the method, the fault current is signaled only when the measurement signal exceeds the first threshold value with an abrupt increase. In this case, the abrupt increase in the measurement signal can represent a change in the difference between the first summation current and the second summation current of at least 10 mA, or of at least 20 mA. Such an embodiment offers the possibility to detect a fault current caused by a person in a more targeted manner and to distinguish it from other effects which slowly, in some cases creepingly, cause changes in the summation currents. This utilizes the effect that a change in a summation current generally occurs abruptly when a person comes into contact with a live component. Accordingly, the measurement signal also changes abruptly. Slow changes in the difference between the two summation currents, for example, due to unequal ambient conditions of the PV strings and associated slowly occurring changes in the leakage currents of the two PV strings, are thus hidden and not signaled. A slow change is to be understood as a change extending over many seconds to minutes, in some cases even hours, as can occur, for example, due to weather.

In one embodiment of the method, a resistive current component of the measurement signal detected by the at least one current transformer can be determined. Optionally, the fault current can be signaled when the measurement signal generated by the current transformer has an abrupt change in a resistive current component by at least 10 mA, or at least 20 mA, when the first threshold value is exceeded. This determination of the resistive current component also enables a more targeted detection of a fault current caused by a person. In contrast to the leakage current, which is effected via a parasitic capacitance and thus represents a reactive current, the fault current flowing due to a contact with a person is usually a resistive current. In one development of the method, a ratio of the resistive and thus ohmic component to the capacitive component can be determined, for example, via a phase relationship between the current flowing toward the ground potential and the AC voltage of the PV modules causing this current.

In one embodiment of the method, the PV generator of the PV installation has a number n, with n>2, of PV strings. In addition, the detection device has an equal number n, with n>2, of toroidal current transformers. In this case, each of the toroidal current transformers is passed through by the DC lines of two different PV strings. In addition, the DC lines of each PV string each pass through two different ones of the toroidal current transformers. This embodiment offers the advantage that not only can a fault current in the PV installation be detected by means of the method, but the PV string of the PV installation assigned to the fault current can also be determined. The reason for this is that with each of its two DC lines, each of the PV strings, that is to say also the PV string assigned to the fault current, passes through two different toroidal current transformers. A fault current in a particular one of the PV strings therefore leads to a corresponding measurement signal in exactly the current transformers that are passed through by the particular PV string. The PV string the DC lines of which pass through both toroidal current transformers, which detect a fault current, is thus very likely to be the PV string that can be assigned to the fault current.

In one embodiment of the disclosure, the entire PV generator can be isolated in response to the signaling of the fault current. Alternatively, however, it is also possible for only the PV string of the PV generator causing the fault current to be isolated in response to the signaling of the fault current, while the remaining PV strings or PV sub-generators not affected by the fault continue to be operated. In this way, a failure of a feed-in compensation connected to the isolation can be minimized. By isolating the PV generator causing the fault current or the PV string causing the fault current, the fault current of the PV generator or of the corresponding PV string is suppressed. In this case, the isolation can be carried out, for example, by the respective PV string being disconnected from the PV inverter, in some cases also short-circuited. In this case, a short circuit of the PV string should, if possible, only take place without disconnection of the PV inverter from the AC grid if the respective PV string has a reverse current diode or is connected via a DC/DC converter to the DC link circuit of the PV inverter.

In an embodiment of the method, DC lines of a first group of PV strings $2.1$-$2.k$ and an equally sized second group of PV strings $2.k+1$-$2.n$ pass through a shared toroidal current transformer such that each of the PV strings $2.1$-$2.k$ of the first group has a first summation current that flows toward the ground potential and is at least approximately compensated by a second summation current of a corresponding PV string of the second group $2.k+1$-$2.n$ flowing toward the ground potential. In this embodiment, a toroidal current transformer can simultaneously be used for 4, 6, 8 or more even-numbered PV strings. By virtue of two PV strings, optionally with different nominal outputs, being treated as PV substrings and being able to be combined into a PV string, it is also possible for a jointly used toroidal current transformer to have an odd total number of PV strings assigned by it. Overall, a cost-effective implementation of the detection device and also of the method can thereby be made possible.

In one embodiment of the method, the two PV strings of a jointly used current transformer are similar to one another such that, in normal operation of the PV installation, a difference between the first leakage current flowing from the first PV string toward the ground potential and the second leakage current flowing from the second PV string toward the ground potential falls below a second threshold value. The term "jointly used" means, in one example, that the measurement signal detected by the current transformer depends on the difference between currents associated with these PV strings. In this case, the combined PV strings should advantageously be selected to be as similar as possible with regard to their parasitic capacitances such that the second threshold value here corresponds to a value of 25% based on a maximum from among the first leakage current and the second leakage current.

In one embodiment, a photovoltaic (PV) inverter according to the disclosure having an AC output for the connection to an AC voltage network (AC grid) and at least two DC inputs for the connection of at least two PV strings of a PV generator has a previously described detection device and/or is designed and configured to carry out the previously described method. The PV inverter can be configured as a single-phase PV inverter or a multi-phase, for example, a three-phase, PV inverter. The PV inverter can have a one-stage design and in particular can be without a DC/DC converter arranged between one of the DC inputs and a DC/AC converter of the PV inverter. Alternatively, however, it is also possible for the PV inverter to be of multi-stage design and to have a DC/DC converter connected upstream of a DC/AC converter of the PV inverter. In a further embodiment, the PV inverter can be configured as a so-called multi-string PV inverter, in which each of the two PV strings is connected to a shared DC link circuit via in each case a separate DC/DC converter.

According to an advantageous embodiment, the PV inverter has a nominal power of at least 10 kW. With such a design, for example, for large PV installations with the correspondingly designed PV inverter, the advantages of the method and of the detection device are particularly important.

In a further embodiment, the PV inverter is configured as a transformerless PV inverter. In such a transformerless PV inverter, the leakage currents flowing from the PV strings toward the ground potential can be particularly pronounced. The method and the detection device can thus be used particularly advantageously in such PV inverters.

BRIEF DESCRIPTION OF THE FIGURES

The disclosure is further explained and described below using exemplary embodiments illustrated in the figures. In the drawings.

DESCRIPTION OF THE FIGURES

Figure 1:
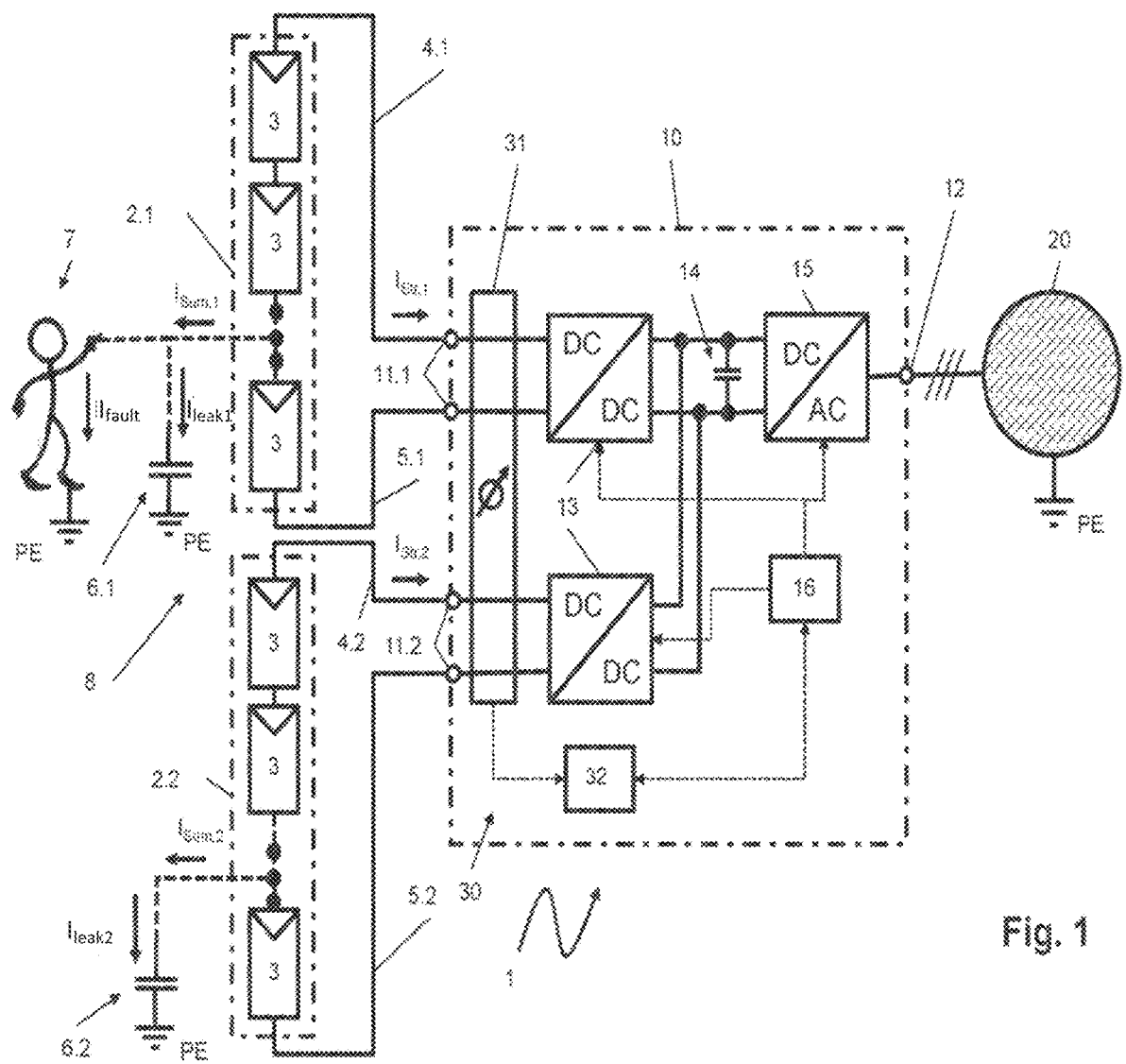
FIG. 1 shows a PV installation having a PV inverter according to the disclosure in one embodiment.

FIG. 1 shows a photovoltaic (PV) installation 1 having an embodiment of a PV inverter 10 according to the disclosure. The PV installation 1 includes a first PV string 2.1 and a second PV string 2.2. Each PV string 2.1, 2.2 has a plurality of PV modules 3 connected in series. The two PV strings 2.1, 2.2 form a PV generator 8. The two PV strings 2.1, 2.2 are designed similarly, in one embodiment, identically, with regard to the number and type of the PV modules 3. In addition, the two PV strings 2.1, 2.2 are arranged close enough together that they are subject to at least similar ambient conditions with regard to irradiation and temperature. By way of example, the photovoltaic inverter 10 is configured as a so-called multi-string inverter. For this purpose, it has at least two DC inputs 11.1, 11.2 for DC lines 4.1, 5.1, 4.2, 5.2 of the two PV strings 2.1, 2.2 from photovoltaic modules 3. Each of the DC inputs 11.1, 11.2 is connected to a shared DC link circuit 14 via a separate DC/DC converter 13. The shared DC link circuit 14 is in turn connected to a DC side of a DC/AC converter 15. The AC side of the DC/AC converter 15 is connected to an AC output 12 of the PV inverter 10. Connected to the example three-phase AC output 12 of the PV inverter 10 in FIG. 1 is an alternating voltage (AC) network 20, which likewise has a three-phase design. The DC inputs 11.1, 11.2 are connected to the DC/DC converters 13 via a current transformer 31; a control circuit or unit 16 of the PV inverter 10 controls the switches of the DC/DC converters 13 and of the DC/AC converter 15 for the desired voltage conversion. The PV inverter 10 furthermore comprises a detection device 30 having the current transformer 31 and an evaluation circuit or unit 32 connected to the current transformer 31. The current transformer 31 is arranged between the inputs 11.1, 11.2 and the DC/DC converters 13 of the PV inverter 10 and, in one embodiment, is configured as a toroidal current transformer. In this case, a measurement signal of the current transformer 31 represents a difference between a first summation current $I_{sum,1}$ flowing from the first PV string 2.1 toward the ground potential PE and a second summation current $I_{sum,2}$ flowing from the second PV string 2.2 toward the ground potential PE. The evaluation circuit 32 is configured to further process, e.g., evaluate, the measurement signal measured by the current transformer. It is also connected, in terms of control technology and for communication, to the control circuit or unit 16 of the PV inverter 10.

The first PV string 2.1 has a first parasitic capacitance 6.1 in relation to the ground potential PE. The second PV string 2.2 has a second parasitic capacitance 6.2 in relation to the ground potential PE. Parasitic capacitances 6.1, 6.2 occur in PV modules 3 and are dependent on the ambient conditions, such as humidity, temperature, precipitation or the like.

A first leakage current $I_{leak,1}$ flows via the first parasitic capacitance 6.1 from the first PV string 2.1 in the direction of the ground potential PE. A second leakage current $I_{leak,2}$ flows via the second parasitic capacitance 6.2 from the second PV string 2.2 in the direction of the ground potential PE. The leakage currents $I_{leak,1}$, $I_{leak,2}$ are capacitive reactive currents which result from an AC potential being superimposed on a DC potential of the PV modules 3 in relation to the ground potential. The leakage currents $I_{leak,1}$, $I_{leak,2}$ together with the parasitic capacitances 6.1, 6.2 are dependent on the ambient conditions of the PV strings 2.1, 2.2, such as humidity, temperature, precipitation, or the like. In some cases, they can change significantly over time, even if rather slowly over time. However, they change in a similar manner for the similar PV strings 2.1, 2.2.

In the event of a fault, e.g., when a grounded person 7 produces a contact between one of the PV strings 2.1, 2.2 and the ground potential PE, in addition to the leakage current $I_{leak,1}$, $I_{leak,2}$, a fault current $I_{fault}$ flows toward the ground potential PE on the PV string 2.1, 2.2 on which the fault was caused. This is illustrated in FIG. 1 by way of example using the example of the first PV string 2.1.

The measurement signal of the current transformer 31 now represents the difference between the first summation current $I_{sum,1}$ and the second summation current $I_{sum,2}$. In this case, the first summation current $I_{sum,1}$ comprises the sum of the first leakage current $I_{leak,1}$ and, in the event of a fault as shown in FIG. 1, the fault current $I_{fault}$. The second summation current $I_{sum,2}$ comprises the sum of the second leakage current $I_{leak,2}$ and the fault current $I_{fault}$ likewise present there in the event of a fault on the second PV string 2.2. For the case shown in FIG. 1 that no fault is present on the second string 2.2, the second summation current $I_{sum,2}$ corresponds to the second leakage current $I_{leak,2}$.

In the case of high-performance PV inverters 10 without galvanic isolation between the DC and AC sides, the vastly predominant part of the summation currents $I_{sum,1}$, $I_{sum,2}$ corresponds to the leakage currents $I_{leak,1}$, $I_{leak,2}$ which are caused by the parasitic capacitances 6.1, 6.2. For the protection of persons 7 against electric shock, sudden changes in the summation currents $I_{sum,1}$, $I_{sum,2}$, as can arise due to the flow of life-threatening currents through human bodies of persons 7, must now be detectable. Such resistive fault currents $I_{fault}$ are already life-threatening at current intensities which can be significantly below the usual current intensities of the non-hazardous capacitive leakage currents $I_{leak,1}$, $I_{leak,2}$. In order to now be able to measure a potentially occurring resistive fault current $I_{fault}$ with such low current intensities reliably and with little effort, it is proposed to dispense with a respectively separate measurement of a summation current $I_{sum,1}$, $I_{sum,2}$ with a leakage current $I_{leak,1}$, $I_{leak,2}$ which is in each case possibly high, but similar for both PV strings 2.1, 2.2. Instead, the current transformer 31 outputs as a measurement signal the difference, that is to say the difference between the summation currents $I_{sum,1}$, $I_{sum,2}$, and thus also the leakage currents $I_{leak,1}$, $I_{leak,2}$, between the two PV strings 2.1, 2.2. This difference is small according to the aforementioned prerequisite of the similarity of the PV strings 2.1, 2.2. A measurement signal that is usually continuously present, i.e., the measurement signal which is present in normal operation of the PV installation 1 without incidence of a fault, i.e., without a fault current $I_{fault}$, is likewise low due to the resulting compensation of the summation currents $I_{sum,1}$, $I_{sum,2}$.

A change of the summation current $I_{sum,1}$, $I_{sum,2}$ in one of the PV strings 2.1, 2.2, for example when a person touches a live conductor, affects only that of the PV strings 2.1, 2.2 on which the fault has occurred and which is thus assigned to the fault. In the event of a fault, the remaining difference between the summation currents $I_{sum,1}$, $I_{sum,2}$ of the similar PV strings 2.1, 2.2 therefore increases significantly relative to the otherwise compensated and usually permanently present measurement signal. This effect is clearly discernible in the measurement signal of the current transformer 31. Accordingly, a correspondingly sensitive, favorable current transformer 31 can be selected, and the fault current $I_{fault}$ can be detected with reliable and favorable means.

Figure 2:
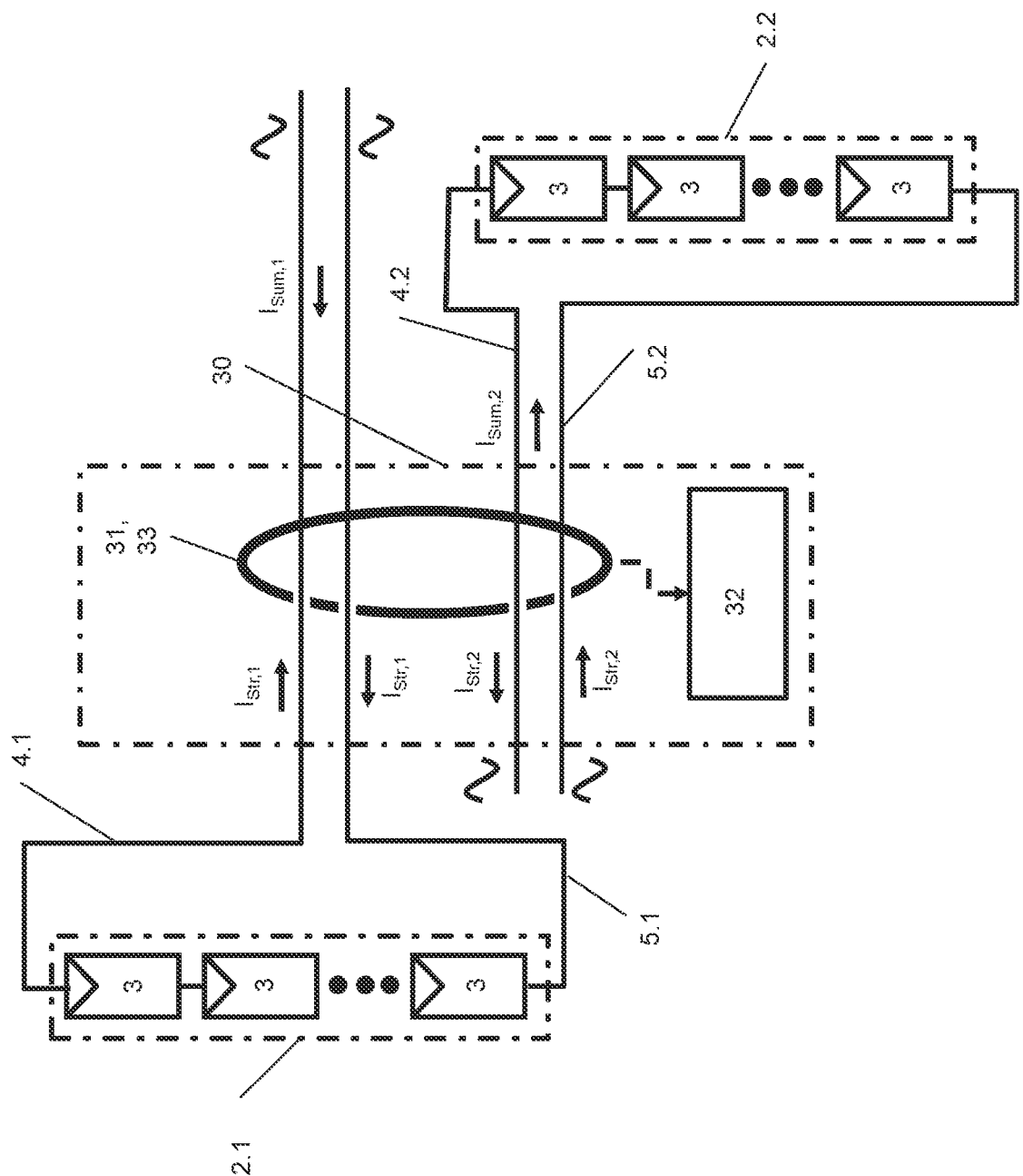
FIG. 2 shows a detection device according to the disclosure in a first embodiment having two PV strings and a jointly used toroidal current transformer.

FIG. 2 shows a first embodiment of a detection device 30 according to the disclosure such as can be arranged, for example, in a PV inverter 10 according to the disclosure of the PV installation 1 of FIG. 1. The detection device 30 contains a current transformer 31, and an evaluation circuit or unit 32 connected to the current transformer 31. The current transformer 31 in FIG. 2 is formed as a toroidal current transformer 33, which is passed through by the two PV strings 2.1, 2.2 of the PV installation 1. The pass-through is designed such that a DC current $I_{Str,1}$ of the first PV string 2.1 flowing in the positive DC line 4.1 is compensated by a DC current $I_{Str,1}$ flowing in the negative DC line 5.1 in the opposite direction through the toroidal current transformer 33 and usually of equal magnitude. The same applies to the DC currents $I_{Str,2}$ of the second PV string 2.2, which flow in its positive DC line 4.2 and in its negative DC line 5.2. The DC currents $I_{Str,1}$, $I_{Str,2}$ are thus usually differential-mode signals that flow within the DC lines. These DC currents $I_{Str,1}$, $I_{Str,2}$ occurring as differential-mode signals in particular do not flow, at least not in normal operation of the PV installation 1 in which no fault current $I_{fault}$ is present, from the DC lines toward the ground potential.

In addition to the DC potential on the positive DC lines 4.1, 4.2 and on the negative DC lines 5.1, 5.2 of the two PV strings 2.1, 2.2, an AC potential is respectively superimposed in relation to the ground potential. The AC signal is present for topology-related reasons because the PV inverter 10 to which the PV strings 2.1, 2.2 are connected on the input side is connected on the output side to the AC grid. The AC signal, which is illustrated in FIG. 2 by means of the wavy lines, is usually a common-mode signal in relation to the ground potential. In conjunction with the parasitic capacitances 6.1, 6.2 of the two PV strings 2.1, 2.2, this results in a respective leakage current $I_{leak,1}$, $I_{leak,2}$ and thus a respective summation current $I_{sum,1}$, $I_{sum,2}$ that flows from each of the PV strings 2.1, 2.2 toward the ground potential PE. The passage through the toroidal current transformer 33 with regard to the summation currents $I_{sum,1}$, $I_{sum,2}$ is now such that the first summation current $I_{sum,1}$ of the first PV string 2.1 passes through the toroidal current transformer in the opposite direction to the second summation current $I_{sum,2}$ of the second PV string 2.2. Since the parasitic capacitances 6.1, 6.2 of the PV strings 2.1, 2.2 are similar, the result in normal operation of the PV strings 2.1, 2.2 (i.e., in the absence of a fault current) is the measurement signal of the toroidal current transformer 33 being compensated as much as possible. If a fault current now occurs in one of the two PV strings 2.1, 2.2, it is added to the leakage current of the faulty PV string and results in a significant measurement signal of the current transformer 33.

The principle described is also applicable to PV inverters 10 with more than two PV strings in that the DC lines of two similar PV strings in each case are guided in pairs in the manner illustrated in FIG. 2 through a current transformer 31, for example, a toroidal current transformer 33. In the case of a number n of PV strings, a number n/2 of current transformers 31, for example, toroidal current transformers 31, are thus required. Alternatively, however, the DC lines 4.1, 4.2, 5.1, 5.2 of any other even number of similar PV strings 2.1, 2.2 can be combined in this way, namely in that the summation current of one half of the PV strings is guided in the one direction and the summation current of the other half of the PV strings is guided in the opposite direction through the shared toroidal current transformer 33 as a current transformer 31.

In applications in which an even number of PV strings 2.1, 2.2 having a shared current transformer 31, as shown in FIG. 1 and FIG. 2, is monitored, locating an abrupt change of a summation current $I_{sum,1}$, $I_{sum,2}$ on one of the PV strings 2.1, 2.2 is possible only indirectly. Although an abrupt change in the entirety of the two PV strings 2.1, 2.2 can be detected, it cannot yet be detected as a result of the design, which of the two PV strings 2.1, 2.2 causes the abrupt increase and thus the fault current $I_{fault}$. One possibility for determining the respectively faulty one of the PV strings 2.1, 2.2 is explained in more detail in connection with FIG. 3.

Figure 3:
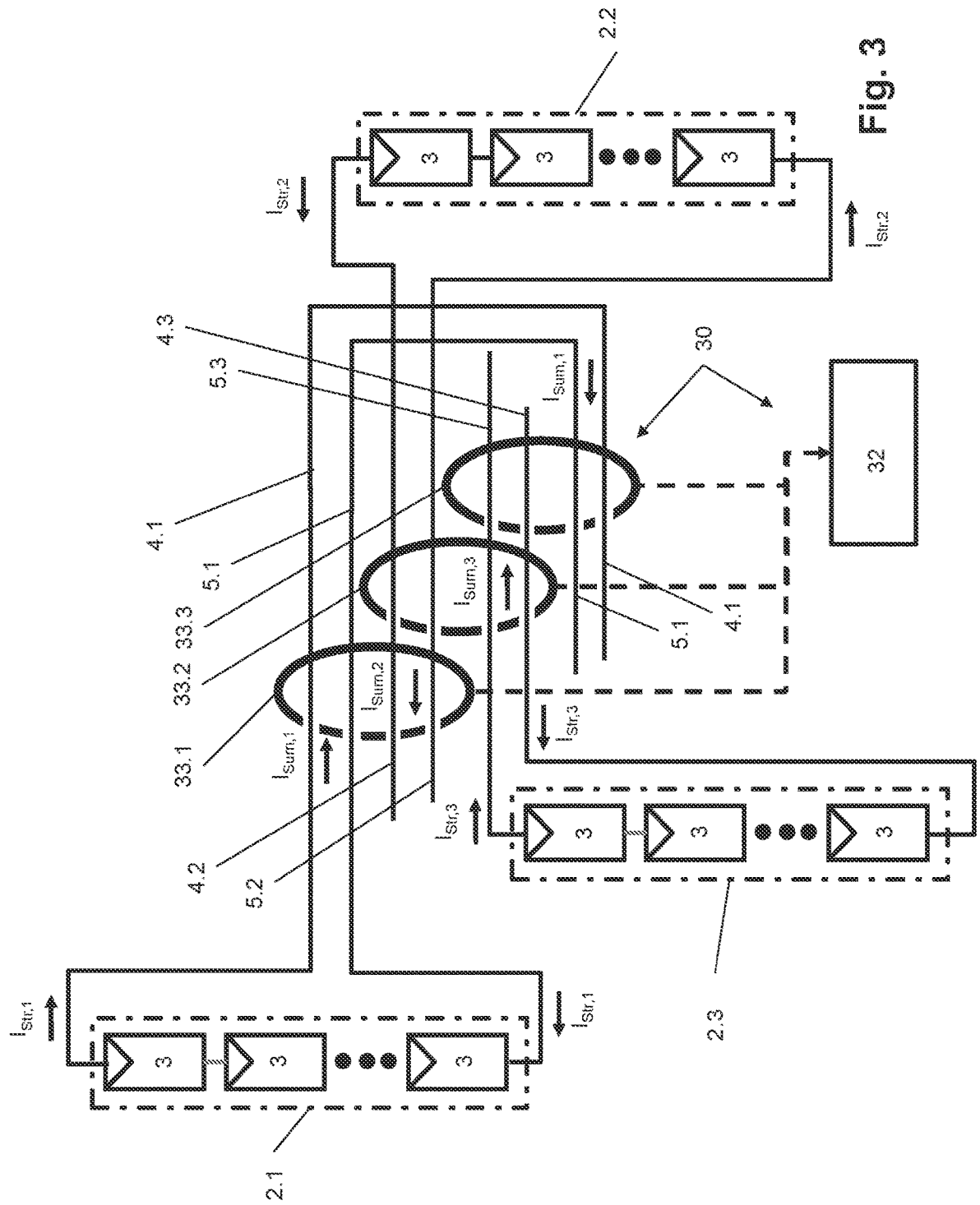
FIG. 3 shows a detection device according to the disclosure in a second embodiment having three PV strings and three toroidal current transformers.

FIG. 3 shows a second embodiment of a detection device 30 according to the disclosure. In some points, the second embodiment is similar to the first embodiment of the detection device 30 according to FIG. 2, which is why, with regard to the commonalities, reference is made to the figure description of FIG. 2. In the following, the differences between the second and the first embodiment are primarily illustrated.

In contrast to the first embodiment, the second embodiment of the detection device 30 is configured for a total of three PV strings 2.1, 2.2, 2.3 and includes three toroidal current transformers 33.1, 33.2, 33.3, which are connected to the evaluation circuit 32. The first DC current $I_{Str,1}$ of the first PV string 2.1 flows through the first toroidal current transformer 33.1 twice, once each in opposite directions. In addition, the first DC current $I_{Str,1}$ of the first PV string 2.1 likewise flows through the third toroidal current transformer 33.3 twice, once each in opposite directions. The second DC current $I_{Str,2}$ of the second PV string 2.2 flows through the second toroidal current transformer 33.2 twice, once each in opposite directions. In addition, the second DC current $I_{Str,2}$ of the second PV string 2.2 likewise flows through the first toroidal current transformer 33.1 twice, once each in opposite directions. The third DC current $I_{Str,3}$ of the third PV string 2.3 flows through the second toroidal current transformer 33.2 twice, once each in opposite directions. In addition, the third DC current $I_{Str,3}$ of the third PV string 2.3 flows through the third toroidal current transformer 33.3 twice, once each in opposite directions. Each toroidal current transformer is therefore always flowed through by the DC currents of a respective pair of two of the PV strings 2.1-2.3. In this case, the pass-through is designed such that the leakage currents $I_{leak,1}$, $I_{leak,2}$ $I_{leak,3}$, and also the summation currents $I_{sum,1}$, $I_{sum,2}$, $I_{sum,3}$ for each pair of PV strings 2.1-2.3 with a shared toroidal current transformer 33.1-33.3 pass through the shared toroidal current transformer 33.1-33.3 in opposite directions. In this way, a respectively pairwise compensation of the summation currents $I_{sum,1}$, $I_{sum,2}$, $I_{sum,3}$ results for each of the toroidal current transformers in this case as well.

With an embodiment shown in FIG. 3, it is possible to locate the PV string 2.1, 2.2, 2.3 that has actually triggered an abrupt change in the summation current. In this case, the toroidal current transformers 33.1, 33.2, 33.3 are used in such a way that the DC lines 4.1, 4.2, 4.3, 5.1, 5.2, 5.3 of two PV strings 2.1, 2.2, 2.3 each are guided through them in the manner of a "daisy chain" so as to bring about compensation.

Each of the PV strings 2.1, 2.2, 2.3 in FIG. 3 is connected in each case to two particular ones of the three toroidal current transformers 33.1, 33.2, 33.3 that are characteristic of it. An abrupt increase in the summation current $I_{sum,1}$, $I_{sum,2}$, $I_{sum,3}$ on one of the PV strings 2.1, 2.2, 2.3 therefore produces a jump of the corresponding measurement signal in the two toroidal current transformers 33.1-33.3 that are respectively characteristic of it. By means of a comparison as to which two of the total of three toroidal current transformers 33.1-33.3 now exhibit an abrupt increase in the measurement signal, the PV string that has caused the fault can be deduced. In this case, the comparison of the measurement signals of the individual toroidal current transformers and the determination of the faulty PV string 2.1-2.3 can be performed via the evaluation circuit or unit 32.

The procedure described here can also be transferred to a configuration of the detection device 30 having more than three PV strings 2.1, 2.2, 2.3. In general, a number n of toroidal current transformers is also required for a number n of PV strings 2.1-2.n in order not only to indicate a fault in one of the PV strings 2.1-2.n but also to determine the respectively faulty one of the PV strings 2.1-2.n.

An inequality of the PV strings 2.1, 2.2, 2.3 considered in pairs and respectively passing through a toroidal current transformer can cause an overregulation of the respective toroidal current transformer 33.1, 33.2, 33.3. Conversely, too great an inequality of the PV strings 2.1, 2.2, 2.3 connected via a toroidal current transformer 33.1, 33.2, 33.3 to the PV inverter 10 can be assumed if the measurement signal of a jointly used toroidal current transformer 33.1, 33.2, 33.3 continuously detects a difference between the summation currents $I_{sum,1}$, $I_{sum,2}$, $I_{sum,3}$ with high current intensity even in normal operation of the PV installation 1, i.e., if this current intensity exceeds a particular rated value as a second threshold value $S_{TH,2}$. In such a case, however, appropriate measures can be initiated, e.g., a different grouping with respect to the jointly used toroidal current transformers 33.1-33.3 and/or, in some cases, a change of individual PV strings 2.1-2.3 with respect to the type and number of PV modules 3 assigned to the PV string 2.1-2.3.

Figure 4:
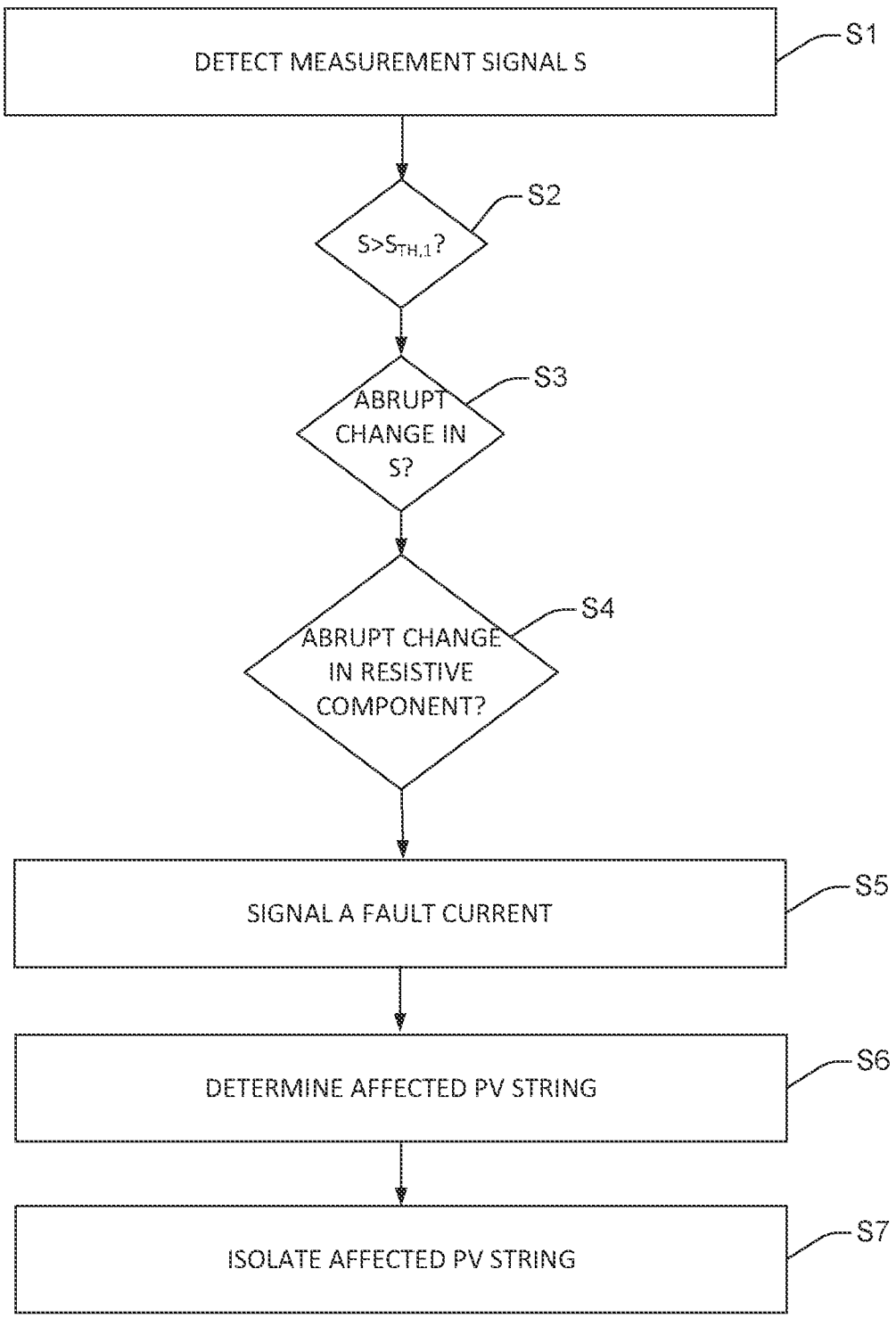
FIG. 4 shows a flow chart of the method according to the disclosure for detecting a fault current in one embodiment.

FIG. 4 shows a flow chart of a method according to the disclosure for detecting a fault current according to one embodiment.

At S1, a measurement signal of the at least one current transformer 31 is detected. The measurement signal represents, for example, a difference between a first summation current $I_{sum,1}$ flowing from the first PV string 2.1 toward the ground potential and a second summation current $I_{sum,2}$ flowing from the second PV string 2.2 toward the ground potential. When using a detection device 30 which is configured according to FIG. 3 for more than two PV strings 2.1, 2.2, the measurement signal can additionally also include a difference between a first summation current $I_{sum,1}$ flowing from the first PV string 2.1 toward the ground potential PE and a third summation current $I_{sum,3}$ flowing from the third PV string 2.3 toward the ground potential PE and/or a difference between a second summation current $I_{sum,2}$ flowing from the second PV string 2.2 toward the ground potential PE and a third summation current $I_{sum,3}$ flowing from the third PV string 2.3 toward the ground potential PE.

At S2, a check is made as to whether the detected measurement signal exceeds a first threshold value $S_{TH,1}$. If not (NO at S2), the method continues at S1. If so (YES at S2), an optional act S3 follows, in which a check is made as to whether the measurement signal changes abruptly. If this is the case (YES at S3), a check is made at optional act S4 as to whether the resistive component of the measurement signal changes abruptly. If this is the case (YES at S4), the method continues at S5. If the check at optional acts S3 or S4 is negative (NO at S3 or S4), the method continues back to S1. If optional acts S3 and S4 are not carried out, the method continues, after a check is made at S2, with act S5 if the detected measurement signal exceeds the first threshold value $S_{TH,1}$.

At S5, a fault current $I_{fault}$ is signaled if the detected measurement signal according to the check at S2 exceeds the first threshold value $S_{TH,1}$. A signaling can, for example, be an alarm signal generated within the evaluation circuit or device 32, which signal can trigger further measures. A signaling of the fault current $I_{fault}$ can also be initiated by the evaluation circuit or unit 32 via a signal transmitted by radio to an operator of the PV installation 1.

Act S5 is followed by an optional act S6, which can be carried out, for example, for an embodiment of the detection device 30 according to FIG. 3. At S6, the affected PV string 2.1, 2.2, 2.3 that has triggered the change in the measurement signal and thus the fault current $I_{fault}$ is determined. After determining the affected PV string 2.1, 2.2, 2.3, it can be isolated at S7 in order to avert possible hazards for persons 7. In this case, the PV installation 1, together with the remaining PV strings not affected by the fault current $I_{fault}$, can continue to be operated.

What is claimed is:

1. A detection device configured to detect a fault current ($I_{fault}$) at a PV generator and/or at DC lines of a PV installation assigned to the PV generator, wherein the PV generator has at least a first PV string and a second PV string, which are connected via in each case two DC lines to a PV inverter of the PV installation, wherein the detection device has at least one current transformer and an evaluation circuit connected to the at least one current transformer, wherein the current transformer comprises a current transformer jointly used by the first PV string and the second PV string, wherein a measurement signal of the jointly used current transformer represents a difference between a first summation current ($I_{sum,1}$) flowing from the first PV string toward a ground potential (PE) and a second summation current ($I_{sum,2}$) flowing from the second PV string toward the ground potential (PE), and wherein the fault current ($I_{fault}$), when it occurs, is a part of the first summation current ($I_{sum,1}$) and/or a part of the second summation current ($I_{sum,2}$).

2. The detection device according to claim 1, wherein the jointly used current transformer comprises a jointly used toroidal current transformer through which the two DC lines of the first PV string and the two DC lines of the second PV string pass for detection of the measurement signal.

3. The detection device according to claim 2, wherein the two DC lines of the first PV string are arranged relative to one another such that, during a normal operation of the PV installation, a DC current ($I_{Str,1}$) flowing therein passes through the toroidal current transformer in two opposite directions, and wherein the two DC lines of the second PV string are arranged relative to one another such that, during the normal operation of the PV installation, a DC current ($I_{Str,2}$) flowing therein passes through the toroidal current transformer in two opposite directions, and wherein a DC line connected to a positive pole of the first PV string is arranged relative to a DC line connected to a positive pole of the second PV string such that, during the normal operation of the PV installation, the DC currents ($I_{Str,1}$, $I_{Str,2}$) in the DC lines assigned to the positive poles pass through the toroidal current transformer in opposite directions.

4. The detection device according to claim 3, wherein the first PV string comprises a combination of two PV substrings having DC lines, the DC lines of which are arranged relative to one another such that, during the normal operation of the PV installation, the DC currents in the DC lines assigned to the positive poles of the PV substrings pass through the toroidal current transformer in a same direction.

5. The detection device according to claim 4, wherein the first PV substring is configured such that a nominal power assigned thereto is at least 50% smaller than a nominal power of the second PV substring.

6. The detection device according to claim 1, wherein the current transformer is configured for a maximum current value which corresponds to a value of at most 50% of the greater of the two values from among a first leakage current ($I_{leak,1}$) and a second leakage current ($I_{leak,2}$), wherein the first leakage current ($I_{leak,1}$) characterizes a current flowing from the first PV string toward the ground potential (PE) in normal operation of the PV installation, and the second leakage current ($I_{leak,2}$) characterizes a current flowing from the second PV string toward the ground potential (PE) in normal operation of the PV installation.

7. The detection device according to claim 1, wherein the PV installation comprises a number of PV strings, wherein the number is greater than two, wherein the detection device has an equal number of toroidal current transformers as the number of PV strings connected to the evaluation circuit of the detection device, wherein for a detection of the measurement signal, each of the toroidal current transformers is passed through by the DC lines of two different PV strings, and wherein the DC lines of each PV string each pass through two different ones of the toroidal current transformers.

8. A method for detecting a fault current ($I_{fault}$) on a PV installation, wherein a PV generator of the PV installation has at least a first PV string and a second PV string, which are connected via in each case two DC lines to a PV inverter of the PV installation, with a detection device that comprises at least one current transformer and an evaluation circuit connected to the at least one current transformer, wherein the current transformer comprises a current transformer jointly used by the first PV string and the second PV string, wherein a measurement signal of the jointly used current transformer represents a difference between a first summation current ($I_{sum,1}$) flowing from the first PV string toward the ground potential (PE) and a second summation current ($I_{sum,2}$) flowing from the second PV string toward the ground potential (PE), and wherein the fault current ($I_{fault}$), when it occurs, is a part of the first summation current ($I_{sum,1}$) and/or a part of the second summation current ($I_{sum,2}$), the method comprising:

detecting a measurement signal of the at least one current transformer, wherein the measurement signal represents a difference between a first summation current ($I_{sum,1}$) flowing from the first PV string toward the ground potential (PE) and a second summation current ($I_{sum,2}$) flowing from the second PV string toward the ground potential (PE); and signaling a fault current ($I_{fault}$) when the detected measurement signal exceeds a first threshold value ($S_{TH,1}$).

9. The method according to claim 8, wherein the signaling of the fault current ($I_{fault,1}$) occurs only when the measurement signal exceeds the first threshold value ($S_{TH,1}$) with an abrupt increase, which represents a change in a difference between the first summation current ($I_{sum,1}$) and the second summation current ($I_{sum,2}$) of at least 10 mA.

10. The method according to claim 8, further comprising:
determining a resistive current component of the measurement signal detected by the at least one current transformer; and
signaling the fault current ($I_{fault}$) only when the measurement signal detected by the current transformer has an abrupt change in the resistive current component by at least 10 mA when the first threshold value ($S_{TH,1}$) is exceeded.

11. The method according to claim 8, wherein the PV generator of the PV installation has a number of PV strings, wherein the number is greater than two, and wherein the detection device has an equal number of current transformers, further comprising determining a PV string causing the fault current by two of the PV strings in each case jointly using one of the current transformers for the detection of the measurement signal, and wherein each of the PV strings uses two of the current transformers in each case.

12. The method according to claim 8, wherein, in response to the signaling of the fault current ($I_{fault}$), isolating the PV generator or only the PV string of the PV generator causing the fault current ($I_{fault}$).

13. The method according to claim 8, wherein DC lines of a first group of PV strings and an equally sized second group of PV strings pass through a shared toroidal current transformer such that each of the PV strings of the first group of PV strings has a first summation current ($I_{sum,1}$) that flows toward a ground potential (PE) and is at least approximately compensated by a second summation current ($I_{sum,2}$) of a corresponding PV string of the second group flowing toward the ground potential (PE).

14. The method according to claim 8, wherein the two PV strings of a jointly used current transformer are similar to one another such that, in a normal operation of the PV installation, a difference between a first leakage current ($I_{leak,1}$) flowing from the first PV string toward the ground potential (PE) and a second leakage current ($I_{leak,2}$) flowing from the second PV string toward the ground potential (PE) falls below a second threshold value ($S_{TH,2}$).

15. The method according to claim 14, wherein the second threshold value ($S_{TH,2}$) corresponds to a value of 25% of leakage current taken from a maximum from among the first leakage current ($I_{leak,1}$) and the second leakage current ($I_{leak,2}$).

16. A PV inverter comprising an AC output for connection to an AC voltage network and at least two DC inputs configured to connect to at least two PV strings of a PV generator, the PV inverter further comprising a detection device, comprising at least one current transformer and an evaluation circuit connected to the at least one current transformer, wherein the current transformer comprises a current transformer jointly used by a first PV string and a second PV string, wherein a measurement signal of the jointly used current transformer represents a difference between a first summation current ($I_{sum,1}$) flowing from the first PV string toward the ground potential (PE) and a second summation current ($I_{sum,2}$) flowing from the second PV string toward the ground potential (PE), and wherein a fault current ($I_{fault}$), when it occurs, is a part of the first summation current ($I_{sum,1}$) and/or a part of the second summation current ($I_{sum,2}$), wherein the detection device is configured to:

detect a measurement signal of the at least one current transformer, wherein the measurement signal represents a difference between a first summation current ($I_{sum,1}$) flowing from the first PV string toward the ground potential (PE) and a second summation current ($I_{sum,2}$) flowing from the second PV string toward the ground potential (PE); and signal a fault current ($I_{fault}$) when the detected measurement signal exceeds a first threshold value ($S_{TH,1}$).

17. The PV inverter according to claim 16, wherein the PV inverter has a nominal power of at least 10 kW.

18. The PV inverter according to claim 16, wherein the PV inverter comprises a transformerless PV inverter.

\* \* \* \* \*